United States Patent [19]

Andreev et al.

[11] Patent Number: 4,512,867

[45] Date of Patent: Apr. 23, 1985

[54] METHOD AND APPARATUS FOR CONTROLLING PLASMA GENERATION IN VAPOR DEPOSITION

[76] Inventors: Anatoly A. Andreev, ulitsa Danilevskogo, 31, kv. 47; Anatoly A. Romanov, ulitsa Valtera, 7, kv. 135, both of Kharkov, U.S.S.R.

[21] Appl. No.: 527,382

[22] Filed: Aug. 29, 1983

Related U.S. Application Data

[63] Continuation of Ser. No. 324,537, Nov. 24, 1981, abandoned.

[51] Int. Cl.³ .............................................. C23C 15/00
[52] U.S. Cl. .................... 204/298; 118/50.1; 118/715; 118/722; 118/723; 204/192 R; 204/164; 219/121 PL; 219/121 PV; 219/76.16; 315/338; 315/344; 427/37; 427/42; 427/47
[58] Field of Search ................ 118/715, 722, 723; 219/123; 204/298, 192 R

[56] References Cited

U.S. PATENT DOCUMENTS

| | | | |
|---|---|---|---|
| 2,972,695 | 2/1961 | Wroe | 313/157 |
| 3,555,347 | 1/1971 | Dickinson | 315/18 |
| 3,719,582 | 3/1973 | Hansen et al. | 204/298 |
| 3,783,231 | 1/1974 | Sablev et al. | 219/123 |
| 3,793,179 | 2/1974 | Sablev et al. | 204/298 |
| 4,048,436 | 9/1977 | Hiratake et al. | 219/123 |
| 4,190,760 | 2/1980 | Kano et al. | 219/123 |
| 4,194,106 | 3/1980 | Rudaz et al. | 219/123 |

*Primary Examiner*—Arthur P. Demers
*Attorney, Agent, or Firm*—Holman & Stern

[57] ABSTRACT

Vapor deposition coating can be performed in apparatus in which a plasma of the coating material is generated from the surface of an electrode. The surface area of the electrode from which the plasma is generated can be selectively adjusted by exposing the plasma generating surface of the electrode to the influence of a magnetic field and adjusting the strength of the magnetic field to spread plasma over the evaporative surface of the electrode to permit more efficient utilization of the electrode. Preferably, the electrode is in the form of a flat metal disc (e.g. titanium) and the magnetic field is generated by a wire coil that substantially encircles or is coaxial to the electrode, with the electrode or an associated element functioning as a core for the coil.

11 Claims, 3 Drawing Figures

METHOD AND APPARATUS FOR CONTROLLING PLASMA GENERATION IN VAPOR DEPOSITION

This is a continuation of application Ser. No. 06/324,537, filed Nov. 24, 1981, now abandoned.

FIELD OF THE INVENTION

This invention relates to the vapour deposition coating of objects (e.g. coating of steel drill bits) by a process in which a plasma of the coating material (e.g. titanium) is generated from the surface of a sacrificial electrode, typically by means of an electric arc.

BACKGROUND OF THE INVENTION

Many techniques are known for applying metal coatings to various objects (sometimes called "work pieces" or "substrates").

Within this broad field of metal coating processes, there exists a group of processes in which the metal is evaporated or vapourized and then deposited on the object to be coated, whether by condensation, ionic attraction, or otherwise.

In one type of vapour deposition coating system the metal vapour is formed as a metal plasma from the surface of an electrode that is positioned within suitable coating apparatus. Such systems are shown in, for example, U.S. Pat. No. 2,972,695 and U.S. Pat. No. 3,793,179.

In vapour deposition coating systems in which the plasma of coating material is generaed from a sacrificial electrode, the plasma is often initiated by a trigger or secondary electrode which momentarily serves to generate an electric arc which creates a spot or series of spots on the primary electrode (e.g. cathode) from which the plasma is generated. After the plasma is initiated, the trigger electrode is silenced and current flow is between the anode and cathode. As the arc current flows between the anode and cathode, plasma-generating spots are created on the sacrificial electrode and the spots tend to move randomly or chaotically across the surface of the sacrificial electrode.

In operating vapour deposition apparatus of this type, the sacrificial electrode is often in the form of a disc and the electrode can be used repeatedly until the metal of the electrode has been consumed. However, from a practical standpoint it has been found that as plasma is generated from the sacrificial electrode, the electrode is not eroded in a uniform way. As a result, the sacrificial electrode must be replaced periodically even though a substantial percentage of its original weight may still exist.

SUMMARY OF THE INVENTION

The present invention is based upon the discovery that the area of the sacrificial electrode from which the plasma of coating material is generated can be selectively altered or varied by subjecting the plasma being generated at the sacrificial electrode to the influence of a magnetic field at the evaporation surface. This is quite different from the conventional use of electromagnets to focus or direct a plasma discharge. In the present situation the magnetic field is used to spread or enlarge the evaporative surface area on the electrode from which the plasma is being generated without asking any deliberate attempt to focus or direct the plasma discharge by means of the magnetic field. By proper adjustment of the strength of the magnetic field, which can be by visual reference to the sacrificial electrode, the plasma can be caused to spread out over substantially the entire operating or evaporative surface of the sacrificial electrode. This results in a greater efficiency in the vapour deposition process and results in more efficient utilization of the sacrificial electrodes.

BRIEF DESCRIPTION OF THE DRAWINGS

The present invention will be further understood by referring to the following drawings.

DETAILED DESCRIPTION

Figure 1:
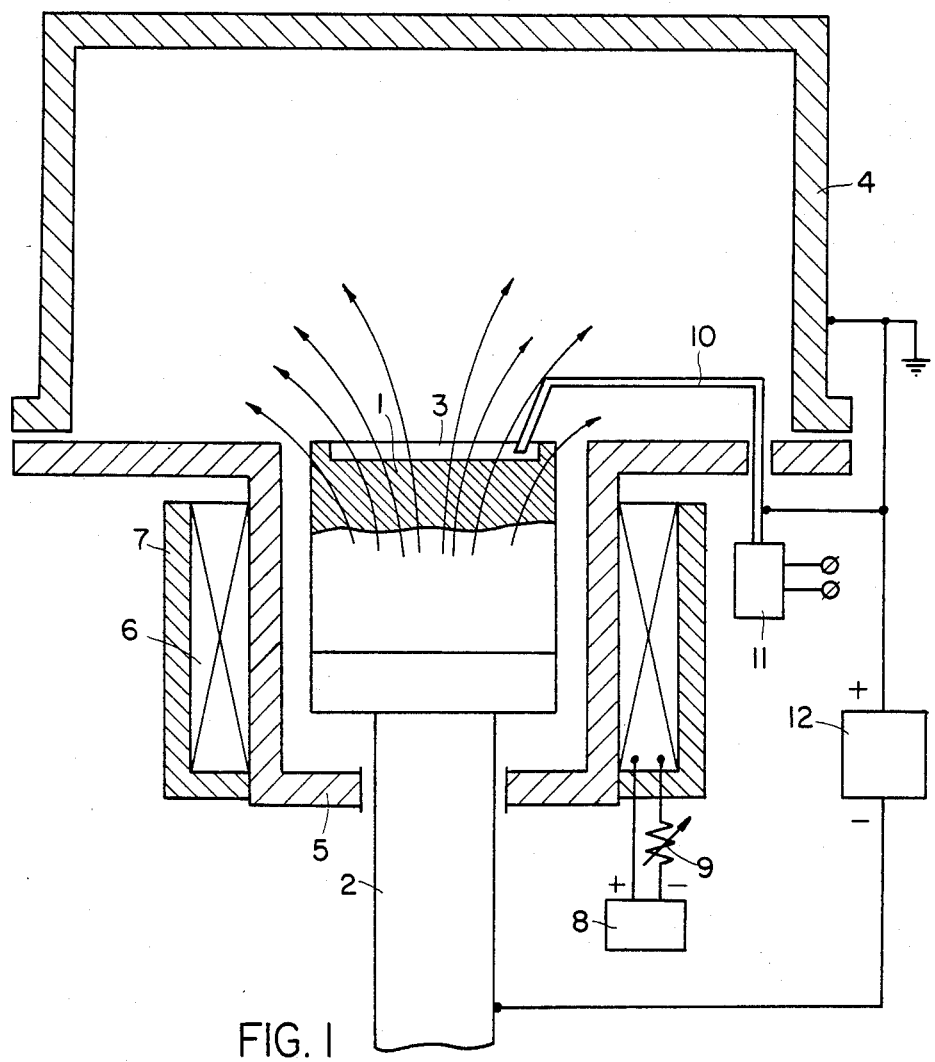
FIG. 1 illustrates an apparatus for vapour deposition coating using a sacrificial electrode.

The proposed apparatus comprises an electrode which is a sacrificial cathode 1 (FIG. 1) made substantially as a one-piece cylinder or disc, secured on a mount 2 whose second function is cooling water supply. The face 3 of the cathode 1 is the working surface evaporated by the electric arc, which is intended for metal plasma generation. This face 3 is hereinafter referred to as a plasma generating surface.

The cathode 1 is enveloped by an anode facing the working surface. The anode in this embodiment is a vacuum chamber 4. Workpieces (not shown) to be coated are arranged in front of the cathode 1 on a suitable holder electrically insulated from the anode.

The cathode 1 and the mount 2 are placed in a barrel 5 made of a non-magnetic material, carrying a magnetic coil 6. The coil 6 is disposed below the plasma generating surface 3 of the cathode 1 so that the force lines (shown by arrows in FIG. 1) of the magnetic field thereof are inclined to the periphery of the plasma generating surface 3 of the cathode 1. The external lateral surface and the surface, which is the reverse of the plasma generating surface 3, of the magnetic coil 6 are enveloped by a magnetic circuit 7. This magnetic circuit 7 is to increase inclination of the force lines of the magnetic field of the coil 6 in relation to the plasma generating surface 3 of the cathode 1, which is supposed to intensify the effect of the magnetic field on the movement of cathode spots over said surface 3.

The coil 6 is connected to supply source 8. The supply circuit of the coil 6 also comprises a potentiometer 9 for adjustment of current therein. In this manner the movement of cathode spots over the surface 3 of the cathode 1 is controlled in order to provide for uniform erosion of said surface 3.

Next to the cathode 1 is a trigger electrode 10 controlled by means of an electromagnet 11.

As the electromagnet 11 is turned on, the trigger electrode 10 momentarily connects the cathode 1 and the anode to each other.

The apparatus is also provided with an arc power supply source 12.

The apparatus for vapour deposition coating operates as follows.

Negative potential is applied from the arc supply source 12 to the cathode 1, the positive pole of the source 12 being connected to the anode (chamber 4) and grounded.

Momentary contact of the trigger electrode 10 with the cathode 1 produces a spark (a plasmoid) initiating an arc discharge between the cathode 4 and the anode. Cathode spots whose number varies with the arc current are created on the working surface of the cathode 1 and tend to move chaotically thereon. These spots also tend to concentrate in the center of the surface 3 of the cathode 1. As soon as the magnetic coil 6 is turned on, cathode spots start circular movement, though chaotic movement persists. Average radius of the circular movement depends on the magnetic field strength and varies as said field produced by the coil 6.

This combination of the chaotic and circular movements makes the cathode spots oscillate in relation to the average radius thus covering the entire surface 3 of the cathode 1.

The amount of current in the coil 6 can be controlled by the potentiometer 9 to adjust the magnetic field within the limits of 5–80 oersteds which corresponds to uniform distribution of cathode spot trajectories over the surface 3 of the cathode 1.

Figure 2:
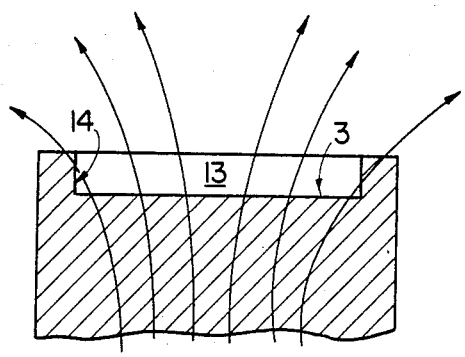
FIG. 2 illustrates a portion of the electrode, according to the invention.

The face of the cathode 1 has a depression 13 (FIG. 2) which is about 1.5 mm deep. The depression 13 keeps the cathode spot from slipping onto the lateral surface of the cathode 1, since the acute angle between the force lines (shown by arrows) of the electromagnetic field of the coil 6 and the internal surface 14 of the depression 13 is directed towards the working surface (FIG. 2). Thus the arc is stabilized. The bottom of the depression 13 is the plasma generating surface 3.

Figure 3:
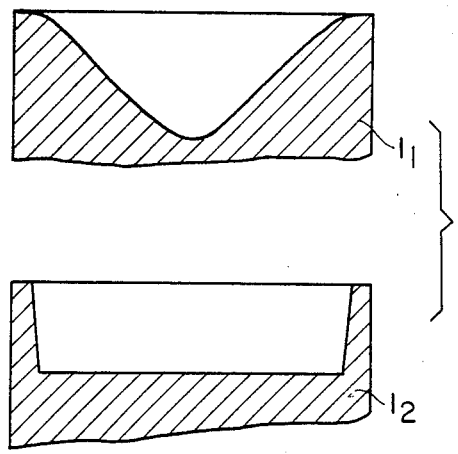
FIG. 3 illustrates in cross-sectional form two sacrificial electrodes as they appear after partial erosion due to plasma generation during a coating process, one representing a typical uncontrolled plasma generation and the other representing plasma generation controlled by the present invention.

Cross sections of two used cathodes $1_1$, $1_2$ (FIG. 3) demonstrate the manner of their erosion.

The cathode $1_1$ clearly shows erosion of the central cathode portion, which is the result of cathode spot movement in the near-axis area of the surface 3 of the cathode in the absence of a magnetic field.

The cross-section $1_2$ of the cathode used with the aid of the magnetic field produced by the coil 6 is entirely different. The current flowing through the coil was adjusted so that cathode spots move over the complete surface 3 of the cathode so that it is uniformly evaporated.

Other modifications of the invention will be apparent to those skilled in the art in the light of the foregoing description.

The proposed method for controlling plasma generation and an apparatus realizing said method make for more uniform erosion of the sacrificial electrode and, consequently, more sparing use thereof, as well as more stable arc burning, which contributes to better quality of deposition coatings and more reliable operation of the apparatus as a whole.

What is claimed is:

1. An apparatus for vapor deposition coating in which a plasma of coating material is generated from the surface of an electrode, said apparatus comprising:
    (a) a sacrificial metal cathode having a plasma generating and face containing a depression whose bottom defines the plasma generating surface, so that cathode spots which are created on the generating surface are prevented from moving to the periphery of said end face;
    (b) means for generating a plasma from said cathode;
    (c) means for producing an electromagnetic field adjacent said plasma generating surface comprising a magnetic wire coil placed coaxially with said cathode and below the level of the plasma generating surface, so that the lines of force of said electromagnetic field extend in an inclined position with respect to the periphery of the plasma generating surface to influence the movement of the cathode spots on said plasma generating surface; and
    (d) means for altering the intensity of the electromagnetic field to selectively control the size of the portion of the cathode from which the plasma is generated, so that a uniform distribution of paths of movement of said cathode spots on said plasma generating surface is provided.

2. The apparatus of claim 1 wherein a cathode holder serves as the core of the magnetic wire coil and is actuated by an electric arc.

3. The apparatus of claim 1 wherein current varying means are operatively connected to said magnetic wire coil so that the intensity of the electromagnetic field on the plasma generating surface may be varied within the range of 5 to 80 oersteds.

4. The apparatus of claim 2 wherein current varying means are operatively connected to said magnetic wire coil so that the intensity of the electromagnetic field on the plasma generating surface may be varied within the range of 5 to 80 oersteds.

5. The apparatus of claim 1 wherein a magnetic circuit means operatively envelopes the magnetic wire coil, to increase the inclination of the lines of force of the electromagnetic field with respect to the plasma generating surface.

6. The apparatus of claim 2 wherein a magnetic circuit means operatively envelopes the magnetic wire coil, to increase the inclination of the lines of force of the electromagnetic field with respect to the plasma generating surface.

7. The apparatus of claim 3 wherein a magnetic circuit means operatively envelopes the magnetic wire coil, to increase the inclination of the lines of force of the electromagnetic field with respect to the plasma generating surface.

8. The apparatus of claim 4 wherein a magnetic circuit means operatively envelopes the magnetic wire coil, to increase the inclination of the lines of force of the electromagnetic field with respect to the plasma generating surface.

9. The apparatus of claim 8 further comprising an anode facing the plasma generating surface which envelopes the cathode.

10. The apparatus of claim 9 wherein the anode comprises a vacuum chamber.

11. The apparatus of claim 10 further comprising a trigger electrode means next to the cathode and controlled by an electromagnet, for producing a spark initiating an arc discharge between the cathode and the anode.

* * * * *